(12) United States Patent
Sato et al.

(10) Patent No.: US 11,867,294 B2
(45) Date of Patent: Jan. 9, 2024

(54) SLIDING MEMBER

(71) Applicant: TPR Co., Ltd., Tokyo (JP)

(72) Inventors: Tomoyuki Sato, Tokyo (JP); Yutaka Kitazume, Tokyo (JP); Tetsuya Nango, Tokyo (JP)

(73) Assignee: TPR Co., Ltd., Tokyo (JP)

( * ) Notice: Subject to any disclaimer, the term of this patent is extended or adjusted under 35 U.S.C. 154(b) by 0 days.

(21) Appl. No.: 18/027,702

(22) PCT Filed: Sep. 30, 2021

(86) PCT No.: PCT/JP2021/036226
§ 371 (c)(1),
(2) Date: Mar. 22, 2023

(87) PCT Pub. No.: WO2023/053379
PCT Pub. Date: Apr. 6, 2023

(65) Prior Publication Data
US 2023/0392687 A1    Dec. 7, 2023

(51) Int. Cl.
*F16J 9/26*       (2006.01)
*C23C 14/06*      (2006.01)
*C23C 14/32*      (2006.01)

(52) U.S. Cl.
CPC .............. *F16J 9/26* (2013.01); *C23C 14/0605* (2013.01); *C23C 14/325* (2013.01)

(58) Field of Classification Search
CPC ........ F16J 9/26; C23C 14/0605; C23C 14/325
See application file for complete search history.

(56) References Cited

U.S. PATENT DOCUMENTS

| 2002/0102398 A1 | 8/2002 | Shi et al. |
| 2015/0018254 A1 | 1/2015 | Araujo et al. |
| 2017/0167608 A1 | 6/2017 | Ooshiro |

(Continued)

FOREIGN PATENT DOCUMENTS

| JP | 2002/544380 A | 12/2002 |
| JP | 2008/297171 A | 12/2008 |
| JP | 2009/241252 A | 10/2009 |

(Continued)

OTHER PUBLICATIONS

Search Report in International Application No. PCT/JP2021/036226 dated Nov. 30, 2021, 4 pages.

(Continued)

*Primary Examiner* — Gilbert Y Lee
(74) *Attorney, Agent, or Firm* — MARSHALL, GERSTEIN & BORUN LLP

(57) ABSTRACT

An object of the present invention is to provide a sliding member coated with a DLC coating in which microfractures on the sliding surface thereof due to the progression of cracks are less likely to occur, and in which an increase in abrasive wear can be reduced. The present invention achieves the above-mentioned object by a sliding member having a DLC coating on the outer peripheral surface thereof, wherein an S band derived from $sp^3$ bonding is observed in the DLC coating in addition to a G band derived from the graphite structure and a D band derived from the defects of the graphite structure, and these bands satisfy specific relationships.

8 Claims, 5 Drawing Sheets

(56) References Cited

U.S. PATENT DOCUMENTS

2021/0270370 A1    9/2021  Sato et al.
2023/0003300 A1    1/2023  Shinohara

FOREIGN PATENT DOCUMENTS

| JP | 5713362 B2 | | 5/2015 |
|---|---|---|---|
| JP | 2016037637 A | * | 3/2016 |
| JP | 2020-200803 A | | 12/2020 |
| WO | WO-2015/121944 A1 | | 8/2015 |
| WO | WO-2016/021671 A1 | | 2/2016 |
| WO | WO-2021/124788 A1 | | 6/2021 |

OTHER PUBLICATIONS

Decision to Grant for Japanese Application No. 2021-559354, dated Jan. 17, 2022.
Notice of Reasons for Refusal for Japanese Application No. 2021-559354, dated Nov. 15, 2021.

* cited by examiner

SLIDING MEMBER

TECHNICAL FIELD

The present invention relates to a sliding member mainly used in an internal combustion engine.

BACKGROUND ART

DLC (diamond-like carbon) coatings are coatings having an amorphous structure (non-crystalline structure) in which $sp^2$ bonding of carbon atoms corresponding to the graphite structure, and $sp^3$ bonding of carbon atoms corresponding to the diamond structure coexist. DLC coatings having various properties can be formed by adjusting the ratio of both binding components.

DLC coatings having excellent wear resistance and sliding properties have been used for sliding members in internal combustion engines which are used in harsh sliding environments. Examples of the sliding member to be used in an internal combustion engine include piston rings, cylinder liners and camshafts.

As the properties of DLC coatings, Patent Documents 1 and 2 disclose that a DLC coating in which an S band derived from $sp^3$ bonding is observed in addition to a G band derived from the graphite structure and a D band derived from the defects of the graphite structure has an improved heat resistance and a high hardness.

RELATED ART DOCUMENTS

Patent Documents

Patent Document 1: JP 5713362 B
Patent Document 2: JP 6586578 B

SUMMARY OF THE INVENTION

Problems to be Solved by the Invention

While various developments have been done on DLC coatings, the present inventors have arrived at the fact that carbon sludge and the like derived from lubricating oil and fuel components are formed due to the complicated operational environment of an internal combustion engine, and the presence of such carbon sludge and the like may lead to an insufficient wear resistance of the DLC coating of a DLC-treated sliding member to cause the occurrence of abrasion.

That is, there is a problem that a sliding member having a conventionally-disclosed DLC coating does not have a sufficient wear resistance (abrasive wear resistance) when a foreign substance such as carbon sludge is mixed.

The present inventors presume that, when such a sliding member is slid in a state where a foreign substance such as carbon sludge is present, minute cracks may occur on the sliding surface of the DLC coating, and the progression of such cracks causes the occurrence of microfractures on the sliding surface, resulting in an increased wear.

The present invention has been made in view of the problem described above, and an object of the present invention is to provide a sliding member which has a good wear resistance (abrasive wear resistance) even in an environment where a foreign substance such as carbon sludge is present.

Means for Solving Problems

As a result of intensive studies to solve the problem described above, the present inventors have found out that the above-mentioned problem can be solved by a sliding member having a DLC coating on the outer peripheral sliding surface thereof, wherein an S band derived from $sp^3$ bonding is observed in the DLC coating in addition to a G band derived from the graphite structure and a D band derived from the defects of the graphite structure, and these bands satisfy specific relationships, thereby completing the present invention. Specifically, the present inventors have made a new finding that the presence of the S band, among the above-described three bands present in a Raman spectrum, has a great impact on the wear resistance of the DLC coating, and also found out that the wear resistance of the DLC coating can be improved by adjusting the peak intensity ratios and the area ratios of the S band, the D band and the G band within specific ranges, in addition to the S band being present.

The present invention provides a sliding member having a DLC coating on the outer peripheral sliding surface thereof, wherein the DLC coating has an S band having a peak in the vicinity of 1150 $cm^{-1}$, a D band having a peak in the vicinity of 1400 $cm^{-1}$ and a G band having a peak in the vicinity of 1580 $cm^{-1}$, in a Raman spectrum; and wherein the ratio ($I_G/I_S$) of the peak intensity of the G band to the peak intensity of the S band is 5.6 or less, and the ratio ($A_G/A_S$) of the peak intensity area of the G band to the peak intensity area of the S band is 4.7 or less.

In the DLC coating, the ratio ($I_G/I_{S+D}$) of the peak intensity of the G band to the sum of the peak intensity of the S band and the peak intensity of the D band is preferably 1.1 or less, and the ratio ($A_G/A_{S+D}$) of the peak intensity area of the G band to the sum of the peak intensity area of the S band and the peak intensity area of the D band is preferably 0.76 or less.

Further, the ratio ($I_G/I_{S+D+G}$) of the peak intensity of the G band to the sum of the peak intensity of the S band, the peak intensity of the D band and the peak intensity of the G band is preferably 0.50 or less, and the ratio ($A_G/A_{S+D+G}$) of the peak intensity area of the G band to the sum of the peak intensity area of the S band, the peak intensity area of the D band and the peak intensity area of the G band is preferably 0.43 or less.

The ratio ($I_D/I_{S+G}$) of the peak intensity of the D band to the sum of the peak intensity of the S band and the peak intensity of the G band is preferably 0.68 or more, and the ratio ($A_D/A_{S+G}$) of the peak intensity area of the D band to the sum of the peak intensity area of the S band and the peak intensity area of the G band is preferably 0.9 or more.

Further, the ratio ($I_D/I_{S+D+G}$) of the peak intensity of the D band to the sum of the peak intensity of the S band, the peak intensity of the D band and the peak intensity of the G band is preferably 0.41 or more, and the ratio ($A_D/A_{S+D+G}$) of the peak intensity area of the D band to the sum of the peak intensity area of the S band, the peak intensity area of the D band and the peak intensity area of the G band is preferably 0.48 or more.

The ratio ($I_S/I_{D+G}$) of the peak intensity of the S band to the sum of the peak intensity of the D band and the peak intensity of the G band is preferably 0.1 or more, and the ratio ($A_S/A_{D+G}$) of the peak intensity area of the S band to the sum of the peak intensity area of the D band and the peak intensity area of the G band is preferably 0.1 or more.

Further, the ratio ($I_S/I_{S+D+G}$) of the peak intensity of the S band to the sum of the peak intensity of the S band, the peak intensity of the D band and the peak intensity of the G band is preferably 0.09 or more, and the ratio ($A_S/A_{S+D+G}$)

of the peak intensity area of the S band to the sum of the peak intensity area of the S band, the peak intensity area of the D band and the peak intensity area of the G band is preferably 0.09 or more.

Moreover, the DLC coating preferably does not substantially contain hydrogen, preferably has a hydrogen content of 0.5 at % or less, and the sliding member is preferably a piston ring.

Effect of the Invention

The present invention enables to provide a sliding member coated with a DLC coating in which microfractures on the sliding surface thereof due to the progression of cracks are less likely to occur, and in which an increase in abrasive wear can be reduced.

MODE FOR CARRYING OUT THE INVENTION

Figure 1:
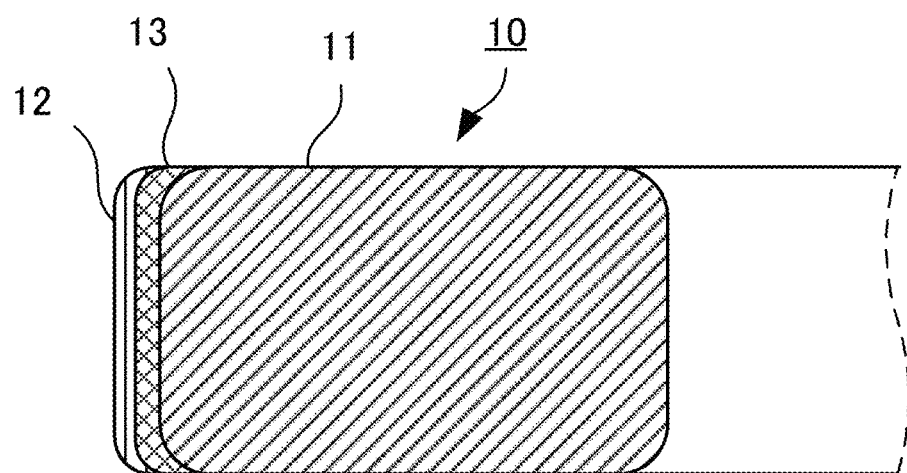
FIG. 1 is a cross-sectional schematic diagram showing a piston ring in which a DLC coating having an underlayer is formed on a piston ring substrate.

While specific embodiments will be described below, each embodiment is shown as one example of the present invention and does not necessary specify the invention according to any one of claims. Further, not all of the characteristics described in the embodiments are essential for the means for achieving the object of the present invention.

An embodiment according to the present invention is a sliding member having a DLC coating on the outer peripheral sliding surface thereof. The sliding member may be one used in an internal combustion engine, or may be one used for those other than internal combustion engines, but can be used particularly suitably as a sliding member used in an internal combustion engine.

Examples of the sliding member to be used in an internal combustion engine include piston rings, cylinder liners and camshafts. Hereinafter, a piston ring as a typical example of the sliding member will be described.

The DLC coating included in the sliding member has an S band having a peak in the vicinity of 1150 cm$^{-1}$, a D band having a peak in the vicinity of 1400cm$^{-1}$ and a G band having a peak in the vicinity of 1580 cm$^{-1}$, in a Raman spectrum; and the ratio ($I_G/I_S$) of the peak intensity of the G band to the peak intensity of the S band is 5.6 or less, and the ratio ($A_G/A_S$) of the peak intensity area of the G band to the peak intensity area of the S band is 4.7 or less.

The S band in the Raman spectrum is a band derived from sp$^3$ bonding. The G band is a band derived from the graphite structure, and the D band is a band derived from the defects of the graphite structure.

The present inventors have found out that, when these three bands are present in the Raman spectrum, and when the ratio ($I_G/I_S$) of the peak intensity of the G band to the peak intensity of the S band is 5.6 or less, and the ratio ($A_G/A_S$) of the peak intensity area of the G band to the peak intensity area of the S band is 4.7 or less, microfractures on the sliding surface due to the progression of cracks are less likely to occur in the DLC coating, and an increase in the abrasive wear thereof can be reduced.

When the S band is absent, the DLC coating has an insufficient wear resistance. In cases where the ratio ($I_G/I_S$) is more than 5.6, cracks are more likely to occur in the DLC coating, and a sufficient wear resistance cannot be obtained. In cases where the ratio ($A_G/A_S$) of the peak intensity area of the G band to the peak intensity area of the S band is more than 4.7, as well, cracks are more likely to occur in the DLC coating, and a sufficient wear resistance cannot be obtained. The peak intensity ratio ($I_G/I_S$) is preferably 5.0 or less, and more preferably 4.0 or less. The lower limit of the ratio ($I_G/I_S$) may be 2.5 or more, but not particularly limited thereto. Further, the peak intensity area ratio ($A_G/A_S$) is preferably 4.1 or less, and more preferably 3.0 or less. The lower limit of the ratio ($A_G/A_S$) may be 1.6 or more, but not particularly limited thereto.

The ratio ($I_G/I_{S+D}$) of the peak intensity of the G band to the sum of the peak intensity of the S band and the peak intensity of the D band is preferably 1.1 or less, and the ratio ($A_G/A_{S+D}$) of the peak intensity area of the G band to the sum of the peak intensity area of the S band and the peak intensity area of the D band is preferably 0.76 or less. The lower limit of the ratio ($I_G/I_{S+D}$) may be 0.4 or more, but not particularly limited thereto; and the lower limit of the ratio ($A_G/A_{S+D}$) may be 0.2 or more, but not particularly limited thereto.

Further, the ratio ($I_G/I_{S+D+G}$) of the peak intensity of the G band to the sum of the peak intensity of the S band, the peak intensity of the D band and the peak intensity of the G band is preferably 0.50 or less, and the ratio ($A_G/A_{S+D+G}$) of the peak intensity area of the G band to the sum of the peak intensity area of the S band, the peak intensity area of the D band and the peak intensity area of the G band is preferably 0.43 or less. The lower limit of the ratio ($I_G/I_{S+D+G}$) may be 0.3 or more, but not particularly limited thereto; and the lower limit of the ratio ($A_G/A_{S+D+G}$) may be 0.19 or more, but not particularly limited thereto.

When the above-described ranges are satisfied, microfractures on the sliding surface due to the progression of cracks are less likely to occur in the DLC coating, and an increase in the abrasive wear thereof can be reduced, which are preferred.

The ratio ($I_D/I_{S+G}$) of the peak intensity of the D band to the sum of the peak intensity of the S band and the peak intensity of the G band is preferably 0.68 or more, and the ratio ($A_D/A_{S+G}$) of the peak intensity area of the D band to the sum of the peak intensity area of the S band and the peak intensity area of the G band is preferably 0.9 or more. The upper limit of the ratio ($I_D/I_{S+G}$) may be 1.4 or less, but not particularly limited thereto; and the upper limit of the ratio ($A_D/A_{S+G}$) may be 2.3 or less, but not particularly limited thereto.

Further, the ratio ($I_D/I_{S+D+G}$) of the peak intensity of the D band to the sum of the peak intensity of the S band, the peak intensity of the D band and the peak intensity of the G band is preferably 0.41 or more, and the ratio ($A_D/A_{S+D+G}$) of the peak intensity area of the D band to the sum of the peak intensity area of the S band, the peak intensity area of the D band and the peak intensity area of the G band is preferably 0.48 or more. The upper limit of the ratio $(I_D/I_{S+D+G})$ may be 0.6 or less, but not particularly limited thereto; and the upper limit of the ratio $(A_D/A_{S+D+G})$ may be 0.7 or less, but not particularly limited thereto.

When the above-described ranges are satisfied, microfractures on the sliding surface due to the progression of cracks are less likely to occur in the DLC coating, and an increase in the abrasive wear thereof can be reduced, which are preferred.

The ratio $(I_S/I_{D+G})$ of the peak intensity of the S band to the sum of the peak intensity of the D band and the peak intensity of the G band is preferably 0.1 or more, and the ratio $(A_S/A_{D+G})$ of the peak intensity area of the S band to the sum of the peak intensity area of the D band and the peak intensity area of the G band is preferably 0.1 or more. The upper limit of the ratio $(I_S/I_{D+G})$ may be 0.15 or less, but not particularly limited thereto; and the upper limit of the ratio $(A_S/A_{D+G})$ may be 0.14 or less, but not particularly limited thereto.

Further, the ratio $(I_S/I_{S+D+G})$ of the peak intensity of the S band to the sum of the peak intensity of the S band, the peak intensity of the D band and the peak intensity of the G band is preferably 0.09 or more, and the ratio $(A_S/A_{S+D+G})$ of the peak intensity area of the S band to the sum of the peak intensity area of the S band, the peak intensity area of the D band and the peak intensity area of the G band is preferably 0.09 or more. The upper limit of the ratio $(I_S/I_{S+D+G})$ may be or less, but not particularly limited thereto; and the upper limit of the ratio $(A_S/A_{S+D+G})$ may be 0.13 or less, but not particularly limited thereto.

When the above-described ranges are satisfied, microfractures on the sliding surface due to the progression of cracks are less likely to occur in the DLC coating, and an increase in the abrasive wear thereof can be reduced, which are preferred.

The above-described peak intensities and the peak intensity areas of the S band, the D band and of the G band in a Raman spectrum can be adjusted to desired values by adjusting the production method of the DLC coating. More specifically, in cases where the DLC coating is formed using the filtered cathodic vacuum arc (FCVA) technique, the pulse bias voltage to be applied may be adjusted, for example, within the range of from −500 V to −2500 V, and preferably from −700 V to −2500 V. In addition, the peak intensities and the peak intensity areas can be adjusted to desired values by adjusting the substrate temperature, chamber pressure (degree of vacuum), arc current, purity of target and the like when forming the DLC coating.

Specific embodiments of the present invention will be described below, with reference to the case where the sliding member is a piston ring, as an example.

The piston ring 10 shown in FIG. 1 is fitted in a piston ring groove (not shown) formed in a piston, and moves reciprocatingly due to the reciprocating motion of the piston while sliding on the inner peripheral surface of a cylinder bore (not shown).

The piston ring 10 may be used as any of the piston rings, namely, a top ring, a second ring and an oil ring. In the case of being used as an oil ring, the piston ring 10 may be used either as an oil ring body of an oil ring having a two-piece configuration composed of the oil ring body and a coil expander, or as a segment of an oil ring having a three-piece configuration composed of two segments (also referred to as side rails) and an expander-spacer. In one embodiment, the piston ring is attached to a piston made of an aluminum alloy, and used as a piston ring against a cylinder bore made of cast iron. However, the materials of the piston and the cylinder are not limited thereto.

The material of a piston ring substrate 11 is not particularly limited, as long as it is a material conventionally used as a piston ring substrate. For example, a stainless steel material, a spring steel material or the like can be suitably used. Specifically, a martensite-based stainless steel, a silicon-chromium steel or the like can be suitably used.

The piston ring 10 shown in FIG. 1 includes: an underlayer 13 formed on the outer peripheral surface of the piston ring substrate 11 which has been subjected to smoothing, and containing Cr, Ti, Si or the like; and a DLC coating 12 formed on the underlayer 13. The adhesion between the DLC coating 12 and the piston ring substrate 11 can be improved by providing the underlayer 13 therebetween.

The underlayer 13 preferably has a film thickness of 0.2 μm or more and 2.0 μm or less. When the underlayer 13 has such a film thickness, the adhesion between the DLC coating 12 and the piston ring substrate 11 can further be improved. It is noted here that the DLC coating 12 may be formed directly on the outer peripheral surface of the piston ring substrate 11 which has been subjected to smoothing, without providing the underlayer 13.

The method of subjecting the outer peripheral surface of the piston ring substrate 11 to smoothing before the formation of the DLC coating 12 is not particularly limited, but it is preferred to perform grinding, buff polishing or the like, to adjust the surface roughness. In cases where the outer peripheral surface of the piston ring substrate 11 has a low surface roughness, the smoothing need not necessarily be performed.

The DLC coating 12 is preferably selected from a-C and ta-C having a hydrogen content of 0.5 at % or less (which is substantially hydrogen free).

The DLC coating 12 preferably has a film thickness of 1μm or more, excluding that of the underlayer. The upper limit of the film thickness is not particularly limited, but is preferably 30μm or less and more preferably 20 μm or less, since too large a film thickness may lead to risks of a decrease in the productivity and an increase in the cost.

Preferred physical properties as a coating of the DLC coating 12, in addition to satisfying the above-described parameters of the S band, the D band and the G band in a Raman spectrum, will be described below.

[Nanoindentation Hardness]

The DLC coating 12 may have a nanoindentation hardness of 15.0 GPa or more and 30.0 GPa or less, 28.0 GPa or less, or 26.0 GPa or less, but not particularly limited thereto. In view of the wear resistance, a coating having a higher hardness is usually preferred. In the present embodiment, however, the DLC coating 12 preferably has a nanoindentation hardness within the above-described range, which is not excessively high. This is because, if the hardness of the coating is too high, the aggression to the cylinder bore sliding surface tends to increase, and in addition, the destruction of the coating occurs when the operation of assembling the piston ring into the piston, and the like, accompanies deformation, since the DLC coating is a coating formed on the outer peripheral surface of the piston ring.

[Young's Modulus]

The DLC coating 12 preferably has a Young's modulus of 335 GPa or less, and more preferably 310 GPa or less. If the DLC coating has a Young's modulus of more than 335 GPa, brittle fractures appear on the outermost surface layer of the DLC coating to result in an increased wear, when foreign substances such as deposits due to carbon sludge etc., or wear debris, dust and the like generated due to sliding, pass over the surface of the DLC coating. On the other hand, the lower limit of the Young's modulus is not particularly limited. However, the delamination within the film is less likely to occur when the DLC coating has a Young's modulus of 120 GPa or more.

The nanoindentation hardness and the Young's modulus were measured using a nanoindentation measuring device, Model HM-2000, manufactured by Fischer Instruments K. K. and using a Vickers indenter, under the conditions of an indentation load of 100 mN and a period of time until the maximum indentation load of 30 s (seconds). The Young's modulus is determined from the resulting load-indentation depth curve. The measurement was carried out at a total of three locations in the circumferential direction of one piston ring, namely, at a position opposite from the abutment of the piston ring and positions 90° on both sides from the abutment. Four points at each of the three locations, 12 points in total, were measured, and the mean value of these measurements was taken as the measured value.

The method of producing the DLC coating according to the present embodiment is not particularly limited. One example thereof may be, for example, a method of forming a coating using the filtered cathodic vacuum arc (FCVA) technique. In the case of using the FCVA technique, the DLC coating may be formed under a single condition, or alternatively, the DLC coating may be formed by performing the film formation multiple times while varying the pulse bias voltage to be applied or without varying the pulse bias voltage. In the case of producing the DLC coating using the FCVA technique, the pulse bias voltage to be applied is set to a value higher than usual, for example, to a value of from −500 V to −2500 V, preferably from −700 V to −2500 V, and more preferably from −1000 V to −2500 V.

EXAMPLES

Next, the present invention will be described in further detail, with reference to Examples and Comparative Examples. However, the present invention is in no way limited to the following Examples.

(Examples and Comparative Examples)

In each of the Examples and Comparative Examples, a piston ring substrate was set in an apparatus, the pressure in the apparatus was reduced by evacuating the interior of the apparatus to vacuum in that state, and then the substrate was heated. Thereafter, each substrate was subjected to the FCVA technique, varying the pulse bias voltage, the substrate temperature, the chamber pressure (degree of vacuum), the arc current, the purity of target and the like, as appropriate, to obtain a piston ring having a DLC coating of each of Examples 1 to 6 and Comparative Examples 1 to 4.

The Raman spectrum of the DLC coating of each resulting piston ring was measured under the following conditions. The measurement was carried out at a total of five locations in the circumferential direction of one piston ring, namely, at both sides (0°, 360°) of the abutment of the piston ring, a position opposite from the abutment and positions 90° on both sides from the abutment, and the mean value of these measurements was taken as the measured value.

Name of apparatus: XploRA PLUS, manufactured by HORIBA, Ltd.
Laser light source: 532 nm
Laser intensity: 1 mW
Spot diameter: 1 μm
Diffraction grating: 1200 lines/mm The waveform of each resulting Raman spectrum was analyzed, and the analyzed results are summarized in Table 1.

TABLE 1

| | Peak intensity ratio | | | | | | | Peak intensity area ratio | | | | | | |
|---|---|---|---|---|---|---|---|---|---|---|---|---|---|---|
| | G/S | G/(S+D) | G/(S+D+G) | D/(S+G) | D/(S+D+G) | S/(D+G) | S/(S+D+G) | G/S | G/(S+D) | G/(S+D+G) | D/(S+G) | D/(S+D+G) | S/(D+G) | S/(S+D+G) |
| Example 1 | 2.59 | 0.44 | 0.31 | 1.33 | 0.57 | 0.14 | 0.12 | 1.66 | 0.24 | 0.19 | 2.24 | 0.69 | 0.13 | 0.12 |
| Example 2 | 2.74 | 0.51 | 0.34 | 1.17 | 0.54 | 0.14 | 0.12 | 1.90 | 0.30 | 0.23 | 1.85 | 0.65 | 0.14 | 0.12 |
| Example 3 | 3.34 | 0.64 | 0.39 | 0.98 | 0.49 | 0.13 | 0.12 | 2.56 | 0.42 | 0.30 | 1.43 | 0.59 | 0.13 | 0.12 |
| Example 4 | 3.56 | 0.72 | 0.42 | 0.87 | 0.46 | 0.13 | 0.12 | 2.87 | 0.51 | 0.34 | 1.18 | 0.54 | 0.13 | 0.12 |
| Example 5 | 4.87 | 0.91 | 0.48 | 0.75 | 0.43 | 0.11 | 0.10 | 4.02 | 0.67 | 0.40 | 1.00 | 0.50 | 0.11 | 0.10 |
| Example 6 | 5.56 | 1.07 | 0.50 | 0.68 | 0.41 | 0.10 | 0.09 | 4.62 | 0.76 | 0.43 | 0.90 | 0.48 | 0.10 | 0.09 |
| Comparative Example 1 | 6.55 | 1.17 | 0.54 | 0.61 | 0.38 | 0.09 | 0.08 | 5.63 | 0.90 | 0.47 | 0.80 | 0.44 | 0.09 | 0.08 |
| Comparative Example 2 | 6.67 | 1.19 | 0.54 | 0.60 | 0.38 | 0.09 | 0.08 | 5.70 | 0.91 | 0.48 | 0.79 | 0.44 | 0.09 | 0.08 |
| Comparative Example 3 | 6.46 | 1.20 | 0.54 | 0.59 | 0.37 | 0.09 | 0.08 | 5.68 | 0.92 | 0.48 | 0.78 | 0.44 | 0.09 | 0.08 |
| Comparative Example 4 | 7.78 | 1.38 | 0.58 | 0.53 | 0.35 | 0.08 | 0.07 | 7.32 | 1.10 | 0.52 | 0.68 | 0.40 | 0.08 | 0.07 |

Subsequently, the DLC coating of each of Example 1, Examples 3 to 6 and Comparative Example 1 was evaluated. First, a test for measuring the amount of wear using a reciprocating friction and wear tester was carried out as follows.

Figure 2:
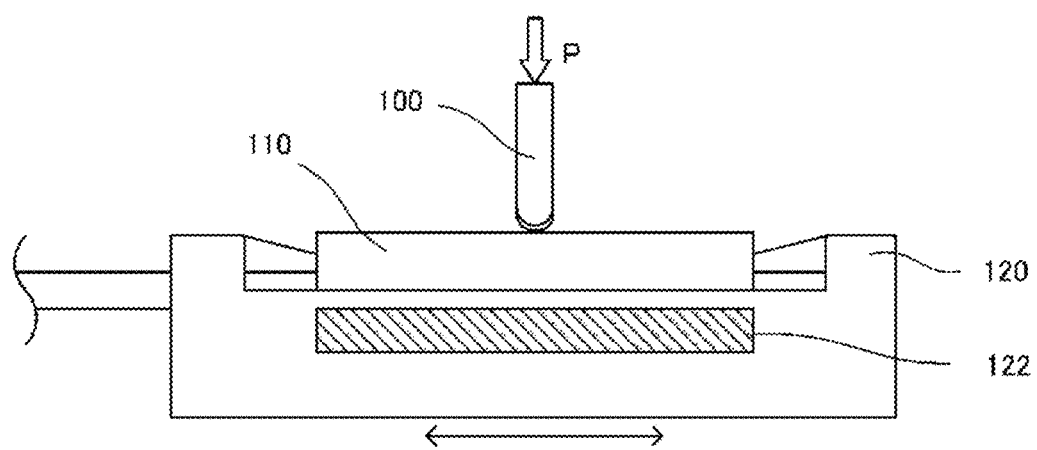
FIG. 2 is a schematic diagram showing the outline of a reciprocating friction and wear test.

FIG. 2 shows the outline of a pin-on-plate type reciprocating friction and wear test. First, a martensite-based stainless steel was formed into piston ring substrates each having a nominal diameter of 86 mm and a width in the sliding direction of 1.2 mm. On the outer peripheral surface of each resulting substrate, the DLC coating of each of the above-described Examples and Comparative Examples was formed, to prepare a piston ring whose outer peripheral sliding surface had been processed. A piston ring member having a circumference length of 20 mm was cut out from each of the three locations, namely, the position opposite from the abutment and the positions 90° on both sides from the abutment, of each resulting piston ring, and subjected to the test. The thus cut-out piston ring members were subjected to final finishing such that each piston ring member after the final finishing had a surface roughness, as a maximum height Rz, of 1.0 μm and the roughness curve of the surface thereof had a plateau shape. Each resulting piston ring member was used as an upper test piece 100.

As a lower test piece 110, a plate having a width of 17 mm, a length of 70 mm and a thickness of 14 mm, supposed to represent a cylinder bore made of flake graphite cast iron which is a JIS FC250-equivalent material and which has a hardness of HRB 100 and a carbide precipitation of 3%, was prepared. Thereafter, the final surface finishing was carried out using a #600 emery paper, and the resulting lower test piece 110 had a surface roughness, as a maximum height Rz, of 1.2 μm.

Conditions for the test for measuring the amount of wear are shown below. On the sliding surfaces of each upper test piece 100 and lower test piece 110, 150 μL of an engine lubricating oil 0W-20 which had been used in an actual engine operation so that carbon sludge and the like thereby generated were concentrated, was supplied in a test period of one hour.

<Test Conditions>
Stroke: 50 mm
Load: 50 N
Rate: 300 cycles/min
Temperature of lower test piece: 80° C. (a heater 122 for heating lower test piece, provided in a movable block 120 was used)
Test period: 60 min The measured results of the amount of wear (mean value, n=3) are shown in Table 2. The values of the amount of wear shown in Table 2 are relative values with respect to that in Comparative Example 1 taken as 1.

TABLE 2

|  | Amount of wear (relative value) |
| --- | --- |
| Example 1 | 0.05 |
| Example 3 | 0.11 |
| Example 4 | 0.15 |
| Example 5 | 0.32 |
| Example 6 | 0.67 |
| Comparative Example 1 | 1.00 |

Next, the DLC coating of each of Example 1, Examples 3 to 6 and Comparative Example 1 was formed on a plate made of SKD 11 material, and subjected to a Rockwell indentation test and a scratch test as follows. The results are shown in Table 3. By performing the Rockwell indentation test and the scratch test, and evaluating the status (length, number of occurrence and the like) of occurrence of cracks, it was possible to confirm the fact that the larger the number of cracks and the longer the length of cracks, the higher the amount of wear, as well.

Figure 3:
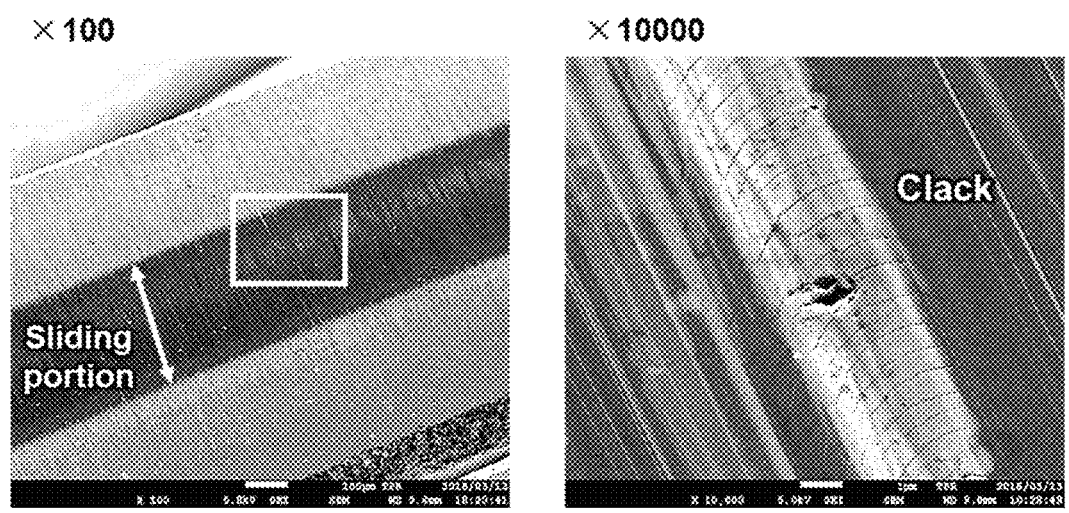
FIG. 3 shows enlarged views (drawing substitute photographs) of cracks occurred on the surface of the DLC coating.
Figure 4:
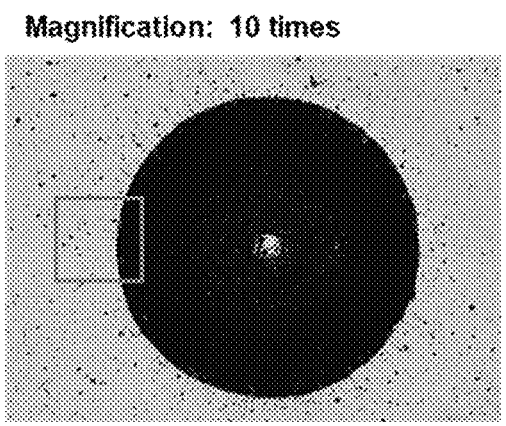
FIG. 4 shows laser microscopic images (drawing substitute photographs) illustrating the results of the Rockwell indentation test on the DLC coating of Example 1.
Figure 4:
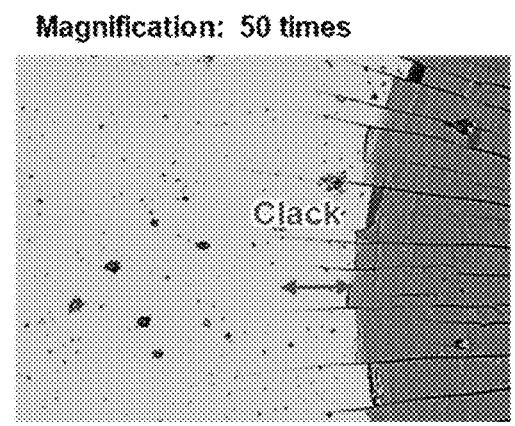
Figure 5:
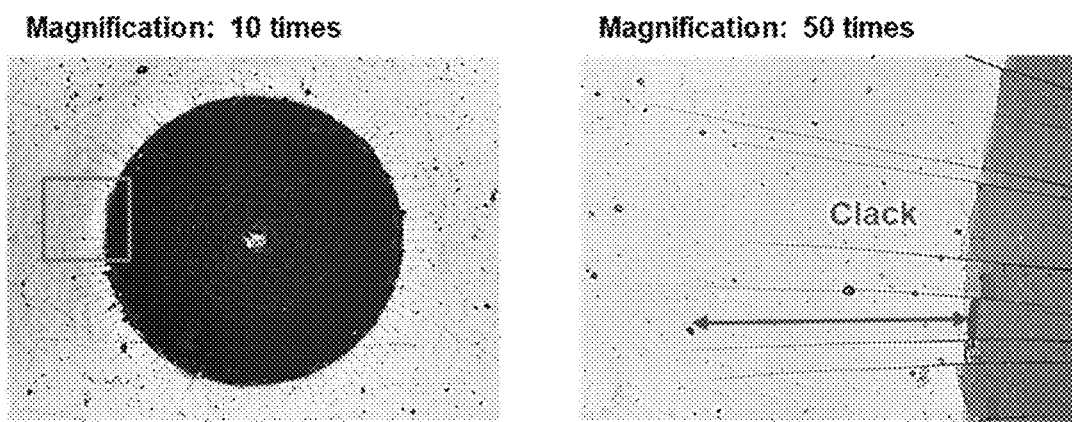
FIG. 5 shows laser microscopic images (drawing substitute photographs) illustrating the results of the Rockwell indentation test on the DLC coating of Comparative Example 1.

Further, FIG. 3 shows electron microscopic images showing the cracks formed on the surface of the DLC coating in an actual engine operation. FIG. 4 and FIG. 5 show laser microscopic images illustrating the results of the Rockwell indentation tests on the DLC coatings of Example 1 and Comparative Example 1, respectively.

<Rockwell Indentation Test>

In accordance with ISO 26443, a diamond indenter with a tip radius of 0.2 mm was pressed into each DLC coating with a load of 150 kgf, and the surface of the DLC coating was observed by a laser microscope. Four visual fields above, below, and the right and left sides of the indentation were enlarged (lens magnification: 50 times), and the mean value of the lengths of the three longest cracks (in the order from the longest crack) within each visual field was calculated. The measurement was carried out three times per sample, and the mean value thereof (n=12) was used for the evaluation. The results are shown in Table 3.

<Scratch Test>

Using a scratch tester manufactured by Anton Paar Ltd., each sample was moved 2 mm horizontally at a rate of 10 mm/min, while maintaining a load constant at 1 N. The results of the scratch test were observed by an electron microscope, and the occurrence of cracks was evaluated (n=3). Each sample was evaluated in accordance with the following criteria, and the evaluation results are shown in Table 3.

A: The occurrence of cracks was not observed on the surface of the DLC coating after the scratch test.
B: The occurrence of cracks was observed on the surface of the DLC coating after the scratch test, but the number of the cracks was relatively small.
C: The occurrence of a certain number of cracks was observed on the surface of the DLC coating after the scratch test.
D: The occurrence of a considerably large number of cracks was observed on the surface of the DLC coating after the scratch test.

TABLE 3

|  | Crack length after Rockwell indentation test (μm) | Evaluation of crack occurrence after scratch test |
| --- | --- | --- |
| Example 1 | 61.4 | A |
| Example 3 | 59.2 | B |
| Example 4 | 66.7 | B |
| Example 5 | 96.0 | C |
| Example 6 | 145.0 | C |
| Comparative Example 1 | 164.9 | D |

DESCRIPTION OF SYMBOLS

10 piston ring
11 piston ring substrate
12 DLC coating
13 underlayer
100 upper test piece
110 lower test piece
120 movable block
122 heater for heating lower test piece

The invention claimed is:

1. A sliding member comprising a DLC coating on the outer peripheral sliding surface thereof,
wherein the DLC coating has an S band having a peak in the vicinity of 1150 cm$^{-1}$, a D band having a peak in the vicinity of 1400 cm$^{-1}$, and a G band having a peak in the vicinity of 1580 cm$^{-1}$, in a Raman spectrum; and
wherein a ratio ($I_G/I_S$) of a peak intensity of the G band to a peak intensity of the S band is 5.6 or less, and a ratio ($A_G/A_S$) of a peak intensity area of the G band to a peak intensity area of the S band is 4.7 or less, a ratio ($I_G/I_{S+D}$) of the peak intensity of the G band to a sum of the peak intensity of the S band and a peak intensity of the D band is 1.1 or less, and a ratio ($A_G/A_{S+D}$) of the peak intensity area of the G band to a sum of the peak intensity area of the S band and a peak intensity area of the D band is 0.76 or less.

2. The sliding member according to claim 1, wherein a ratio ($I_G/I_{S+D+G}$) of the peak intensity of the G band to the sum of the peak intensity of the S band, a peak intensity of the D band and the peak intensity of the G band is 0.50 or less, and a ratio ($A_G/A_{S+D+G}$) of the peak intensity area of the G band to a sum of the peak intensity area of the S band, a peak intensity area of the D band and the peak intensity area of the G band is 0.43 or less.

3. The sliding member according to claim 1, wherein, in the DLC coating, a ratio ($I_D/I_{D+G}$) of a peak intensity of the D band to a sum of the peak intensity of the S band and the peak intensity of the G band is 0.68 or more, and a ratio ($A_D/A_{S+G}$) of a peak intensity area of the D band to a sum of the peak intensity area of the S band and the peak intensity area of the G band is 0.9 or more.

4. The sliding member according to claim 1, wherein, in the DLC coating, a ratio ($I_D/I_{S+D+G}$) of a peak intensity of the D band to a sum of the peak intensity of the S band, the peak intensity of the D band and the peak intensity of the G band is 0.41 or more, and a ratio ($A_D/A_{S+D+G}$) of a peak intensity area of the D band to a sum of the peak intensity area of the S band, the peak intensity area of the D band and the peak intensity area of the G band is 0.48 or more.

5. The sliding member according to claim 1, wherein, in the DLC coating, a ratio ($I_S/I_{D+G}$) of the peak intensity of the S band to a sum of a peak intensity of the D band and the peak intensity of the G band is 0.1 or more, and a ratio ($A_S/A_{D+G}$) of the peak intensity area of the S band to a sum of a peak intensity area of the D band and the peak intensity area of the G band is or more.

6. The sliding member according to claim 1, wherein, in the DLC coating, a ratio ($I_S/I_{S+D+G}$) of the peak intensity of the S band to a sum of the peak intensity of the S band, a peak intensity of the D band and the peak intensity of the G band is 0.09 or more, and a ratio ($A_S/A_{S+D+G}$) of the peak intensity area of the S band to a sum of the peak intensity area of the S band, a peak intensity area of the D band and the peak intensity area of the G band is 0.09 or more.

7. The sliding member according to claim 1, wherein the DLC coating has a hydrogen content of 0.5 at % or less.

8. The sliding member according to claim 1, wherein the sliding member is a piston ring.

* * * * *

UNITED STATES PATENT AND TRADEMARK OFFICE
CERTIFICATE OF CORRECTION

PATENT NO. : 11,867,294 B2
APPLICATION NO. : 18/027702
DATED : January 9, 2024
INVENTOR(S) : Tomoyuki Sato et al.

It is certified that error appears in the above-identified patent and that said Letters Patent is hereby corrected as shown below:

In the Claims

At Column 11, Line 10, "$(I_D/I_{D+G})$" should be -- $(I_D/I_{S+G})$ --.

At Column 12, Line 9, "is" should be -- is 0.1 --.

Signed and Sealed this
Eleventh Day of March, 2025

Coke Morgan Stewart
*Acting Director of the United States Patent and Trademark Office*